United States Patent [19]
Hasegawa et al.
[11] 3,900,883
[45] Aug. 19, 1975

[54] PHOTOCONDUCTIVE CELL MATRIX ASSEMBLY

[75] Inventors: Nobuo Hasegawa, Uji; Toshio Yamashita, Katano; Saburo Kitamura, Kyoto, all of Japan

[73] Assignee: Matsushita Electric Industrial Co., Ltd., Kadoma, Japan

[22] Filed: Sept. 28, 1973

[21] Appl. No.: 401,605

[30] Foreign Application Priority Data

Oct. 2, 1972 Japan .............................. 47-99344

[52] U.S. Cl. ........................ 357/32; 357/68; 357/72
[51] Int. Cl. ............................................ H01l 5/00
[58] Field of Search ........... 317/234; 357/72, 32, 68

[56] References Cited

UNITED STATES PATENTS

| | | | |
|---|---|---|---|
| 3,436,611 | 4/1969 | Perry | 357/68 |
| 3,560,256 | 2/1971 | Abrams | 317/234 |
| 3,602,635 | 8/1971 | Romankiw | 317/234 |
| 3,615,949 | 10/1971 | Hicks | 317/234 |
| 3,622,384 | 11/1971 | Davey et al. | 357/68 |
| 3,779,841 | 12/1973 | Sanders | 317/234 |

*Primary Examiner*—Michael J. Lynch
*Assistant Examiner*—E. Wojciechowicz
*Attorney, Agent, or Firm*—Stevens, Davis, Miller & Mosher

[57] ABSTRACT

A photoconductive cell matrix assembly having an insulator substrate, a photoconductive layer formed on the substrate, and two electrodes connected to the photoconductive layer in a form of an X Y matrix, the improvement residing in the construction of the insulating layer at the crossing points of both X and Y connection lines.

6 Claims, 2 Drawing Figures

PHOTOCONDUCTIVE CELL MATRIX ASSEMBLY

This invention is concerned with the field of semiconductor devices.

It is known to employ an evaporation film of $SiO_2$ or $CaF_2$ as an insulating layer for thin film integrated circuits.

However, since the formation of these evaporation films requires the heating of the substrate in a vacuum condition, it is difficult to apply those evaporation films for assembly of electronic components which cannot withstand high temperatures. It is also pointed out that satisfactory conditions for forming a complete evaporation film having no pin holes can hardly be established, so that the yield rate of the product is lowered. An insulating layer of a glassy substance is also not applicable for assembly of heat sensitive electronic components, since the formation of such a glassy insulation layer requires a high temperature of some 500°C thru 600°C. Electrode formation by conductive paint and the sintering of the glassy insulating material at a high temperature would produce impurities which might spoil the electronic components.

Furthermore, the ceramic substrate tends to be deformed or damaged due to the heat.

A sheet such as Mylar (trademark) or plastic plate onto which the electrodes is printed are not suitable for manufacturing highly dense electronic articles.

It is therefore an object of the present invention to provide electronic components, especially a photoconductive cell matrix, which as the far as prior art is concerned, have not been manufactured without difficulty due to their inability to withstand high temperature.

When AC or DC pulses are applied between each pair of electrodes of each photoconductive cell in a form of photoconductive layer, the cells which receive more light energy exhibit lower electric resistance than those cells which are not subjected to light.

This feature can be utilized for reading punched cards. For this purpose, some hundreds of CdS cells, as well as their electrodes, are disposed in a plane in the form of a matrix. In this matrix, each of a plurality of first common lines interconnects one electrode of each cell in the same line (This line of electrode is, for example, negative and extends parallel to the X direction) and forms cubic or three-dimensional crossings with others of a plurality of lines connecting the other electrode of each cell in the same line (This line of elecrode is, for example, positive and extends parallel to the Y direction). These three-dimensional crossings must include an insulating layer disposed between positive and negative lines of electrodes in order to avoid a short circuit therebetween.

The layer of CdS cells and the insulating layer is formed preferably by the screen method, since it is required to form these layers in a thickness between 20 and 30μ. One of the electrodes is formed of a Te alloy which makes blocking contact with the CdS cell, the other being of a In - Sn alloy or In - Al alloy which make ohmic contact with the CdS cell, and both electrodes are formed by means of the evaporation method.

Since the electrodes contain such alloy as would melt at low temperature i.e. Te or In, the insulating layer at each crossing point which is formed subsequently may be heated to a high temperature, for otherwise the electrodes which has been formed would melt down.

This requirement i.e. to form the insulating layer at such low temperature as would not cause the melting of under laid electrode is quite satisfied by the present inventiion.

Furthermore, the present invention provides rapid and steady connection at each crossing point.

According to the invention, each crossing point is constructed by a first electrode formed by the evaportion method, an insulating layer formed on said first electrode by the screen method and consisting of a resin of the epoxy family, and a second electrode formed on the insulating layer by the evaporation method.

The epoxy resins constituting the insulating layer is preferably charged with 40 thru 80 percent by weight of quartz sand or alumina having diameters of 1 thru 10μ as fillers so as to control the fluidity of the resins during hardening. The availability of said epoxy resins with fillers can preferably last for longer than 30 minutes.

It is also required that the epoxy resins with fillers can get completely hard within 30 minutes under a temperature below 150°C.

The hardened film should be of uniform thickness within the range of between 20μ and 30μ, and must have no pin holes.

The materials used for the layers should be strong enough to prevent breakage of the lines connecting the electrodes and be intimate to both the ceramic substrate and epoxy resin of the insulating layer. These materials may be, for example, Ni, Au, Sn, or Al in a form of films.

The features of the present invention will become more apparent from the following description of the preferred embodiment with reference to the drawings in which.

THE FIRST EMBODIMENT

Figure 1:
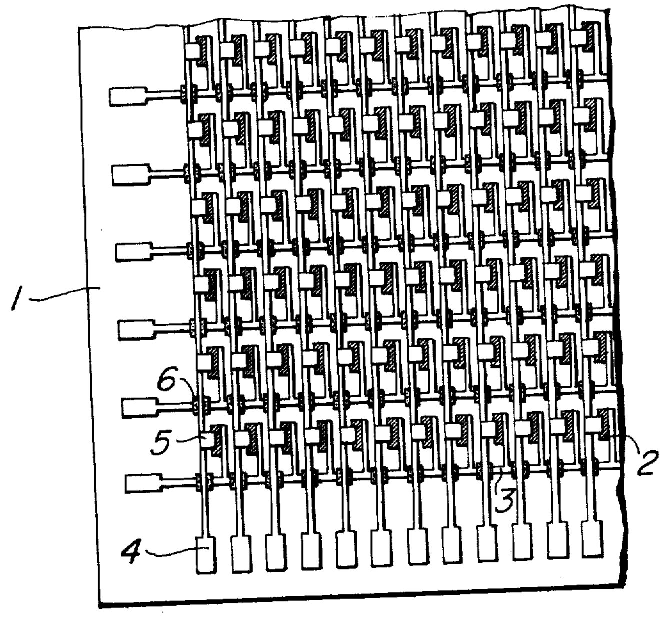
FIG. 1 is a plan view of a photoconductive cell matrix assembly embodying the present invention.

Referring to the drawings, numeral 1 designates a ceramic substrate of alumina onto which a CdS photoconductive layer 2 is applied and printed by the screen method whereby a plurality of cells are disposed regularly spaced from one another in two dimensions X and Y. Numerals 3, 4, and 5 designate metallic evaporation films serving as electrodes.

The electrodes 3 is made of In - Sn alloy which make ohmic contact with the CdS cell and are formed by the evaporation method.

The electrodes 4 are made of a Sn alloy and are also formed by the evaporation method.

The electrodes 5 are also evaporation films but of a Te alloy which makes blocking contact with the CdS cell 2.

Figure 2:
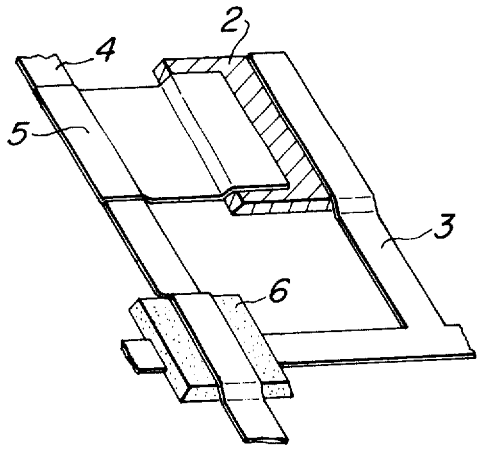
FIG. 2 is an enlarged schematic view of a photoconductive cell employed in the matrix shown in FIG. 1.

As clearly seen from FIG. 2 insulating layer 6 is interposed between the electrode 3 and the electrode 4. This insulating layer 6 is made of epoxy resins of the one package type containing 70 percent by weight of quartz sand powder having diameters of 2 thru 3μ.

This insulating layer is disposed onto the electrode 3 which constitutes an X axis of the matrix by means of the screen method.

Having been maintained at 150°C for 30 minutes, the resin turns to a hard insulating layer having a uniform thickness of between 20 and 30μ and having no pin holes at all.

On this insulating layer 6, another electrode 4 of Sn alloy which constitute a Y axis crossing with the X axis is formed by the evaporation method.

It is to be understood that the photoconductive cell matrix thus obtained comprises X axes formed by a first group of electrodes and Y axes formed by a second group of electrodes, wherein X axes and Y axes form cubic or three-dimensional crossings having interposed their between insulating layers 6 at the points where they meet with each other.

THE SECOND EMBODIMENT

The matrix of the second embodiment has the same construction as that of the first one. However, in this embodiment, electrodes are formed in such a way that the X and Y electrodes are first cut at portions corresponding to the pattern of the first mask, then the cut out portions are filled by using a second mask having a corresponding pattern to cut out portions.

THE THIRD EMBODIMENT

In the described embodiments, axes X are negative and axes Y are positive. Alternatively, in the matrix of the third embodiment, the electrodes of Te alloy are connected to the X axes to make the X axes positive, while the electrodes of In - Sn alloy are connected to the Y axes to render the Y axes negative.

THE FOURTH EMBODIMENT

The whole construction of the fourth embodiment is identical with those of the previously described embodiments. In this case, the epoxy resins constituting the insulating layer is of a two packages type consisting of a resin and a hardener. The resin and the hardener are mingled with fillers of quartz sand powders which amount to 40 percent by weight and of diameters within the range of between 1μ and 10μ. The insulating layer as formed with this epoxy resin of two packages type can serve as effectively as the insulating layer formed with resins of the one-package type.

THE FIFTH EMBODIMENT

In the foregoing embodiments, the fillers charged in the epoxy resins are powders of quartz sand. In the fifth embodiment, the quartz sand is substituted by a powder of alumina having diameters of 1 thru 10μ which amount to 40 thru 80 percent by weight.

The insulating layer consisting of epoxy resin containing fillers of powdered alumina can serve efficiently for constitution of matrixes of the first to fourth embodiments.

THE SIXTH EMBODIMENT

In the foresaid embodiments 1 thru 5, either or both of the X electrodes and Y electrodes are evaporation films of Sn alloy. In the sixth embodiments, this Sn alloy is substituted by respective alloy of Al, Au, or Ni.

Thus, in the sixth embodiment, either or both of the X electrodes and Y electrodes are formed with evaporation films of Al alloy, Au alloy, or Ni alloy. These electrodes can serve efficiently for the constitution of matrixes explained as the first to fifth embodiments.

THE SEVENTH EMBODIMENT

Complete ohmic contact cannot be obtained without having the In electrodes directly in contact with the CdS cells. However, respective metals of Sn, Au, Ni, or Al can solely play the role of the electrodes. Thus in the seventh embodiment, the matrix is of the same construction as those of the first to sixth embodiments and comprises X and Y electrodes consisting of Sn, Au, Ni, or Al metal formed by the evaporation method making direct contact with the CdS cells.

In further modifications, photoconductive cells of CdSe or PbS are used in place of CdS cells.

Also, the alumina for constitution of the substrate can be substituted by steatite, forstelite, or zirconia.

It is to be noted that the matrixes of the present invention provides advantageous effects as follows.

1. Since the insulating layer interposed between the X electrodes and Y electrodes at every crossing point is formed with epoxy resins which can get hard at relatively low temperature, say below 150°C, it is less likely that the electronic components will be damaged during the formation of the insulating layer.

Thus, matrices of any electronic components which are not resistant to heat, especially of CdS photoconductive cell which would be changed in composition and diode characteristic at high temperature, can be obtained wherein the electronic component does not suffered from heat. For the same reason, the deformation of the substrate due to heat is less likely to occur. Moreover, the epoxy resins are commercially available at low price, leading to economical manufacturing.

2. No short circuit will occur at the crossing points, since the insulating layer is thick enough to reach 20 to 30μ and no pin holes can exist in such layer.

3. Since the resins constituting the insulating layer contain fillers such as powders of alumina or quartz sand the fluidity is so reduced that the resin cannot flow out or spread therearound. The insulating layer formed with this type of resin is advantageous also in that it exhibit a high hardness, small thermal expansion or shrinkage. The intimacy of this insulating layer with the electrodes and with the ceramic is so great that the peeling off of the layers can hardly (be) occur.

4. The density in the matrix can be high enough so that the complicated pattern of the matrix can be designed without troubles.

5. Manufacturing become simpler and easy since the insulating layer of the resin can be formed by the printing method.

What is claimed is:

1. A photoconductive cell matrix assembly comprising a ceramic substrate having islands of photoconductive layers formed thereon, a pair of electrodes secured to each of said islands, first common lines connecting one of the electrodes on said photoconductive layers and extending in the X axis direction of the matrix and second common lines connecting the other of the electrodes on said photoconductive layers and extending in the Y axis direction of the matrix, said first and second common lines forming an X–Y matrix network, wherein each of said first and second common lines forms a three-dimensional crossing having interposed therebetween an insulating layer of a resin of an epoxy family containing at least one of the group consisting of quartz sand and alumina fine powder as a filler at each of the crossing portions.

2. A photoconductive cell matrix assembly as claimed in claim 1, wherein said insulating layer is formed by a screen printing method.

3. A photoconductive cell matrix assembly as claimed in claim 1, characterized in that the diameter of the particles of said filler is within the range from 1 to 10$\mu$.

4. A photoconductive cell matrix assembly as claimed in claim 1, characterized in that the content of said filler is from 40 to 80 percent by weight.

5. A photoconductive cell matrix assembly as claimed in claim 3, characterized in that the content of said filler is from 40 to 80 percent by weight.

6. A photoconductive cell matrix assembly as claimed in claim 1, characterized in that the resin of an epoxy family is an epoxy resin.

* * * * *